United States Patent [19]
Joshi

[11] Patent Number: 5,416,449
[45] Date of Patent: May 16, 1995

[54] MODULATOR WITH HARMONIC MIXERS

[75] Inventor: Shankar R. Joshi, Elmont, N.Y.

[73] Assignee: Synergy Microwave Corporation, Paterson, N.J.

[21] Appl. No.: 247,697

[22] Filed: May 23, 1994

[51] Int. Cl.$^6$ .......................... H03C 1/60; H03D 1/24
[52] U.S. Cl. ..................... 332/170; 332/164;
329/354; 329/357; 455/21; 455/47; 455/109;
455/203; 455/302; 455/325; 327/113
[58] Field of Search .............. 332/163, 164, 167, 168,
332/170, 171, 172, 178; 307/512; 455/20–22,
47, 109, 118, 131, 203, 302, 313, 323, 325, 326,
327, 328; 328/16; 329/354, 357, 358, 366, 370;
331/37–43

[56] References Cited

U.S. PATENT DOCUMENTS

| | | | |
|---|---|---|---|
| 3,320,546 | 5/1967 | Allen et al. | 331/40 X |
| 4,099,228 | 7/1978 | Cohn | 331/42 X |
| 4,817,201 | 3/1989 | Bonato | 455/325 |
| 5,020,148 | 5/1991 | Bonato | 455/302 |

OTHER PUBLICATIONS

Synergy Microwave Corp. "Standard Parts Catalog", 1992, p. 31.

Primary Examiner—David Mis
Attorney, Agent, or Firm—Lerner, David, Littenberg, Krumholz & Mentlik

[57] ABSTRACT

An improved modulator circuit for mixing a modulation signal with a carrier signal includes first and second harmonic mixers which are operative to produce modulated output signals at an output frequency corresponding to both the sum and the difference of the modulation signal frequency and the even harmonic frequencies of the carrier signal frequency. In one configuration employing a 90° hybrid, the output signals of the harmonic mixers are combined to produce a single sideband modulated output signal. A novel harmonic mixer circuit is also provided along with demodulator circuits and methods of modulating and demodulating modulation signals.

39 Claims, 4 Drawing Sheets

MODULATOR WITH HARMONIC MIXERS

FIELD OF THE INVENTION

The present invention relates to electrical signal modulator and demodulator circuits having harmonic mixers. Such modulators and demodulators are especially useful in high frequency communication applications such as for single sideband (SSB) modulators and other similar signal modulation and demodulation applications.

BACKGROUND OF THE INVENTION

Today, over-the-air communications channels are being reallocated to higher and higher frequency bands due to increased demand on presently allocated frequency bands in the electromagnetic spectrum. This is largely due to the recent proliferation of communications involving cellular bands, personal communication networks (PCNs) and wireless communications. With this explosive increase in over-the-air communications and the reallocation of communications channels to higher frequencies, there is a great need to provide improved electronic circuits capable of operating at higher frequencies.

One type of electronic circuit used extensively in communications is known as a modulator. Generally, a modulator is used to frequency shift a slow varying or lower frequency input signal, such as one's voice or video signals, up to a higher frequency for transmission. This frequency shifting is accomplished generally by mixing a high frequency local oscillator (LO) or carrier signal with an intermediate frequency (IF) or modulation signal, to produce a modulated output signal having a frequency typically at the sum and the difference of the carrier signal frequency and modulation signal frequency, i.e., a frequency shifted double sideband signal centered around the carrier frequency. One type of widely-used modulator, known as a single sideband (SSB) modulator, can produce either a lower or upper sideband frequency signal by cancelling one of the sidebands at the output of the modulator and thereby reduce the band width occupied by the resultant modulated signal.

Many modulators in use today are quite expensive when used for high frequency applications for a number of reasons. One significant reason is the dramatic increase in costs associated with providing the electronic components designed for processing signals at higher frequencies. In fact, doubling the frequency of the carrier signal will usually more than double the cost of one or more of the modulator components. For example, components such as power dividers, which are typically used in modulators, become increasingly expensive when constructed to process signals at higher frequencies. The increased costs in the circuitry needed for processing high frequency signals is typically passed on to the consumer, resulting in higher prices for communications equipment used for high frequency communications.

Another reason why modulators designed for use at higher frequencies are expensive is due to the difficulty in achieving proper amplitude and phase balance of signals within the modulator circuit. It is often necessary to adjust the phase of signals within the modulator circuit by, for example, introducing additional components. This leads to an increase in the cost of the modulator due to the costs of additional circuit elements and labor associated with correcting and balancing the phase and amplitude characteristics of the modulator circuit. Modulators requiring a high frequency carrier signal input also require generation of a high frequency oscillator or carrier signal. Thus, the cost of the modulator greatly increases due to the increased cost of high frequency oscillators and synthesizers which are needed to provide the requisite high frequency carrier signal.

Many modulators today employ double balanced mixers for mixing a carrier frequency signal with a modulation frequency signal to produce the modulated output signal. However, a problem with these modulators that use double balanced mixers is that in order to generate a high frequency modulated output signal, the carrier signal or local oscillator must initially provide the high frequency signal to the mixer. However, once a high frequency carrier signal is initially introduced to the modulator, it then becomes increasingly difficult to control the modulator's performance due to the fact that stray elements such as capacitance and lead inductance will affect the tuning.

Another problem with modulators using double balanced mixers is achieving sufficient carrier suppression in the output signal. Because the carrier frequency signal is typically not desired in the output signal, any presence of the carrier frequency must be eliminated or suppressed from the output signal, a process which is difficult and expensive to achieve since the output signal is usually quite close in frequency to the carrier signal.

An even further problem with modulators using double balanced mixers is achieving sufficient isolation between the carrier signal and the modulated output signal. The least resistance path for the carrier to get into the modulated signal is through the mixers. This translates to the isolation between the local oscillator (LO) port and the modulated signal (RF) port, commonly known as LO/RF isolation, provided all other precautions have been taken to avoid the leakage of the carrier signal into the modulated output port. LO/RF isolation depends on the balance in the transformers and the diode junctions within the mixer circuit.

Therefore, because of the foregoing problems that exist with present modulators, there is a great and long-felt need to provide improved modulator and demodulator circuits to solve the problems associated with the generation and processing of high frequency modulated signals.

SUMMARY OF THE INVENTION

The present invention meets these above needs by obtaining the benefits associated with low frequency oscillator or carrier signals while still achieving the requisite higher frequency modulated signals.

According to the present invention, there is provided a modulator circuit including a first harmonic mixer with first and second inputs and an output for providing a first electrical output signal, a second harmonic mixer having first and second inputs and an output for providing a second electrical output signal, and carrier input means for providing first and second electrical input carrier signals to the first inputs of the first and second harmonic mixers respectively. The first and second carrier signals have a carrier frequency and the first and second harmonic mixers are operative to produce even and odd harmonic frequencies of this carrier frequency. The modulator circuit further includes modulation input means to provide first and second electrical input modulation signals to the second inputs of the first and second harmonic mixers, the first and second modulation signals both having the same modulation frequency, and having a 90° phase difference therebetween. The first and second harmonic mixers are further operative to produce first and second output signals having output frequencies corresponding to both the sum and the difference of the modulation frequency and the even harmonic frequencies of the carrier frequency.

Preferably, the modulator circuit further includes combining means for combining the first and second output signals to produce by phase cancellation a single sideband output signal having a single sideband frequency corresponding to either the sum or the difference of the modulation frequency and the even harmonic frequencies of the carrier frequency. In such an arrangement, the single sideband frequency can correspond to either the sum or difference of the modulation frequency and a second, third, or fourth harmonic frequency of the carrier frequency. In preferred embodiments, the single sideband frequency can be at least two or four times the carrier frequency plus or minus the modulation frequency. In addition, the modulator circuit may also include filter means for filtering out undesired frequencies in the single sideband output signal, and can include a high-pass, low-pass or band-pass filter. Preferably, the combining means is a 90° hybrid, and the carrier input means includes divider means for receiving and dividing a primary carrier signal into the first and second carrier signals. Preferably, the divider means is an in-phase power divider.

There are a number of preferred configurations for the first and second harmonic mixers used in accordance with the present invention. In one novel embodiment, the first and second harmonic mixers each comprise a first transformer having primary and secondary windings, and a second transformer comprising a transmission line formed by a pair of conductors. The first input of the harmonic mixer being coupled to the primary windings of the first transformer, the second input of the harmonic mixer is coupled to the secondary windings of the first transformer, and the output of the harmonic mixer is coupled to one of the conductors of the transmission line. The harmonic mixer further includes a diode ring quad having four diode junctions and four diodes, the diode junctions being provided between adjacent diodes, the first diode junction being coupled to the secondary windings of the first transformer and the second and fourth diode junctions being coupled to the other conductors of the transmission line.

In another preferred embodiment, the first and second harmonic mixers each include an input transmission line having a first impedance and being coupled to the first input of the harmonic mixer, first and second intermediate transmission lines having a second impedance, and an output transmission line having a third impedance, and a first diode pair having first and second diodes, an input diode junction and an output diode junction. The output diode junction is coupled to a first inductor and to the output transmission line. A second diode pair is provided having first and second diodes, an input diode junction and an output diode junction, the output diode junction being coupled to a second inductor and to the second intermediate transmission line. The first input of the harmonic mixer is coupled to the first and second intermediate transmission lines through the input transmission line and the second input of the harmonic mixer is coupled to the input diode junctions of the first and second diode pairs through the first and second intermediate transmission lines.

In yet another preferred embodiment, the first and second harmonic mixers each comprise a first transformer having primary and secondary windings, and a second transformer having primary and secondary windings, and a first diode pair having first and second diodes, an input diode junction and an output diode junction. The input diode junction is coupled to the secondary windings of the first transformer and the output diode junction is coupled to the secondary windings of the second transformer. A second diode pair is provided having first and second diodes, an input diode junction and an output diode junction, the input diode junction being coupled to the secondary windings of the first transformer and the output diode junction being coupled to the secondary windings of the second transformer. The first input of the harmonic mixer is coupled to the primary windings of the first transformer, the second input of the harmonic mixer is coupled to the secondary windings of the first transformer, and the output of the harmonic mixer is coupled to the primary windings of the second transformer.

In a further preferred embodiment, the first and second harmonic mixers each include a transformer having primary and secondary windings. The first input of the harmonic mixer is coupled to the primary windings and the second input of the harmonic mixer is coupled to the secondary windings. The mixers further include an output transmission line having a first impedance, a first diode pair having first and second diodes, an input diode junction and an output diode junction, the output diode junction being coupled to the first inductor and to the output transmission line, and a second diode pair having first and second diodes, an input diode junction and an output diode junction, the output diode junction being coupled to a second inductor and to the output transmission line. The input junctions of the first and second diode pairs are coupled to the secondary windings of the transformer.

In a yet further preferred embodiment, the first and second harmonic mixers each include a first transformer having primary and secondary windings, the primary windings being coupled to the first input of the harmonic mixer and the secondary windings being connected to the second input of the harmonic mixer. The mixers include a second transformer having a transmission line comprising first and second conductors, first and second inductors, and a diode ring quad having four diode junctions between four adjacent diode pairs. The first and third diode junctions are coupled to the secondary windings of the first transformer, the second and fourth diode junctions are coupled to the second transformer and to the first and second inductors, and the output of the harmonic mixer is coupled to one of the conductors of the transmission line.

A demodulator circuit in accordance with the present invention is also provided, and includes first and second harmonic mixers, carrier input means for providing signals with a carrier frequency to the first inputs of the harmonic mixers, which are operative to produce even and odd harmonic frequencies of the carrier frequency, and modulated input means for providing first and second modulated signals to the second inputs of the harmonic mixers. The first and second modulated signals have a 90° phase difference therebetween and a modulated frequency corresponding to either the sum or the difference of a modulation frequency of a modulation signal and the even harmonic frequencies of the carrier frequency. The harmonic mixers are operative to produce first and second demodulated output signals at the modulation frequency with a 90° phase difference therebetween.

Preferably, the modulated input means comprises a 90° hybrid for receiving a primary modulated signal and dividing it into the first and second modulated signals. The carrier input means preferably includes divider means for receiving a primary carrier signal and dividing it into first and second carrier signals, and preferably consists of an in-phase power divider. The demodulator also preferably includes combining means for combining the demodulated output signals to produce a first real output sideband signal corresponding to the modulation signal and a second image sideband output signal corresponding to a mirror sideband image of the modulation signal. Preferably, the combining means comprises a 90° hybrid.

Methods for modulating and demodulating electrical signals are also provided in accordance with the present invention.

The objects, features and advantages of the present invention will be more readily apparent from the detailed description of the preferred embodiments set forth below, taken in conjunction with the accompanying drawings.

DETAILED DESCRIPTION OF PREFERRED EMBODIMENTS

Figure 1:
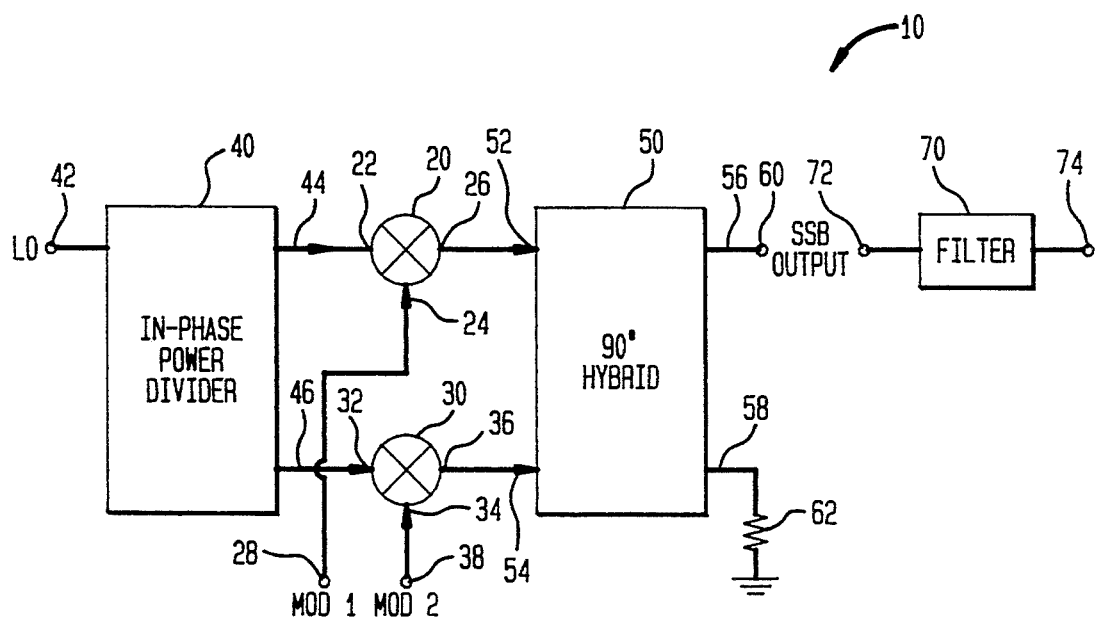
FIG. 1 is a schematic diagram of a preferred embodiment of the present invention configured as a modulator.

Referring to the figures in which like numerals refer to like portions thereof, FIG. 1 shows a circuit in block diagram form configured as a single sideband (SSB) modulator in accordance with a preferred embodiment of the present invention. The modulator, generally designated as 10, comprises a first harmonic mixer 20, a second harmonic mixer 30, an in-phase power divider 40 and a 90° hybrid 50.

In-phase power divider 40 includes a local oscillator (LO) port 42 and output ports 44 and 46. Local oscillator port 42 is configured to accept a periodic oscillator or primary carrier signal having a carrier frequency. The primary carrier signal introduced at local oscillator port 42 is split by in-phase power divider 40 into two, in-phase secondary carrier signals which are provided to output ports 44 and 46 respectively. Preferably, each secondary carrier signal will have approximately one-half the power of the primary carrier signal and the secondary carrier signals will be in-phase, i.e., each signal will have the same phase angle as the other. In-phase power divider 40 is a conventional power divider such as the in-phase power divider part no. SPDC5 sold by Synergy Microwave Corporation of Paterson, N.J.

First harmonic mixer 20 includes a first input port 22, a second input port 24 and an output port 26. Likewise, second harmonic mixer 30 includes a first input port 32, a second input port 34 and an output port 36. First input port 22 of first harmonic mixer 20 is connected to output port 44 of in-phase power divider 40 while first input port 32 of second harmonic mixer 30 is connected to output port 46 of in-phase power divider 40.

Second input port 24 of first harmonic mixer 20 is connected to a first modulation port (MOD 1) 28 and second input port 34 of second harmonic mixer 30 is connected to a second modulation port (MOD 2) 38. Modulation ports 28 and 38 are configured to receive user-supplied modulation signals having the same modulation frequency but with a phase difference of 90° therebetween. The modulation frequency, of course, will depend on the type of information to be modulated by modulator 10. For instance, if the information is audio signals such as the human voice, the modulation frequency is typically between 10 Hz and 20 KHz. On the other hand, if the information is video signals, then the modulation frequency will typically be between 0 and 15 MHz.

Harmonic mixers 20 and 30 are identical circuits, each receiving two input signals and producing a modulated output signal incorporating components having frequencies at the sum and the difference of the modulation frequency and the even harmonic frequencies of the carrier frequency. As explained further below, by virtue of the property of the antiparallel diode junctions of the harmonic mixer, the odd harmonics of the fundamental carrier frequency mixed with the modulation frequency will be suppressed in the output. In addition, the even harmonic frequencies of the carrier frequency will be suppressed in the output signal.

The modulated output signal at output port 26 of first harmonic mixer 20 will therefore have a modulated output frequency of the sum and the difference of the modulation frequency introduced at modulation port 28 and the even harmonic frequencies of the carrier frequency of the signal introduced at first input port 22. Correspondingly, output port 36 of second harmonic mixer 30 will also have a modulated output frequency of the sum and the difference of the modulation frequency of the signal introduced at modulation port 38 and the even harmonic frequencies of the carrier frequency signal introduced at input port 32. Modulated output signals at output ports 26 and 36 of first and second harmonic mixers 20 and 30 will have double sideband signals centered at the even harmonic frequencies of the carrier frequency and will have equal amplitudes. However, the output signals will have a phase difference of 90° therebetween due to the introduction of the modulation signals at modulation ports 28 and 38 with a 90° phase difference.

Although modulator 10 is useful to produce first and second double sideband signals at output ports 26 and 36 of harmonic mixers 20 and 30, hybrid 50 is used to provide a single sideband (SSB) output. Hybrid 50 includes two input ports 52 and 54 and two output ports 56 and 58. Output ports 26 and 36 of first and second harmonic mixers 20 and 30 are connected to input ports 52 and 54 of hybrid 50. Output port 58 of hybrid 50 is connected to a resistor 62, which is in turn connected to ground. Resistor 62 preferably has a resistance equal to that of the system impedance, for example 50 ohms, 75 ohms, etc. Output port 56 is connected to a single sideband (SSB) output port 60. Hybrid 50 can be a conventional 3 dB 90° hybrid with four ports such as part no. SQ73, used for frequencies between 1800–1900 MHz, sold by Synergy Microwave Corporation of Paterson, N.J.

Hybrid 50 is employed to introduce an additional 90° phase shift to one of the input signals at input 52 or 54. With this additional 90° phase shift, cancellation of one of the sidebands of the input signals will occur due to the fact that if two 180° out of phase signals of similar amplitude are combined, the result is a cancellation of the signal thus producing a single sideband modulated output signal at port 60. Thus, the modulated output signal of modulator 10 produced at single sideband output port 60 will be either a lower or upper sideband signal translated in frequency to the even harmonic frequencies of the carrier signal plus or minus the modulation frequency of the modulation signal. Filtering techniques can also be applied to the modulated output signal to eliminate unwanted frequencies. Thus, a filter 70 can be connected to single sideband output port 60 via filter input port 72 to produce a filtered output signal at filter output port 70. Filter 70 may consist of a high pass, low pass or band pass filter or any combination thereof.

Figure 2A:
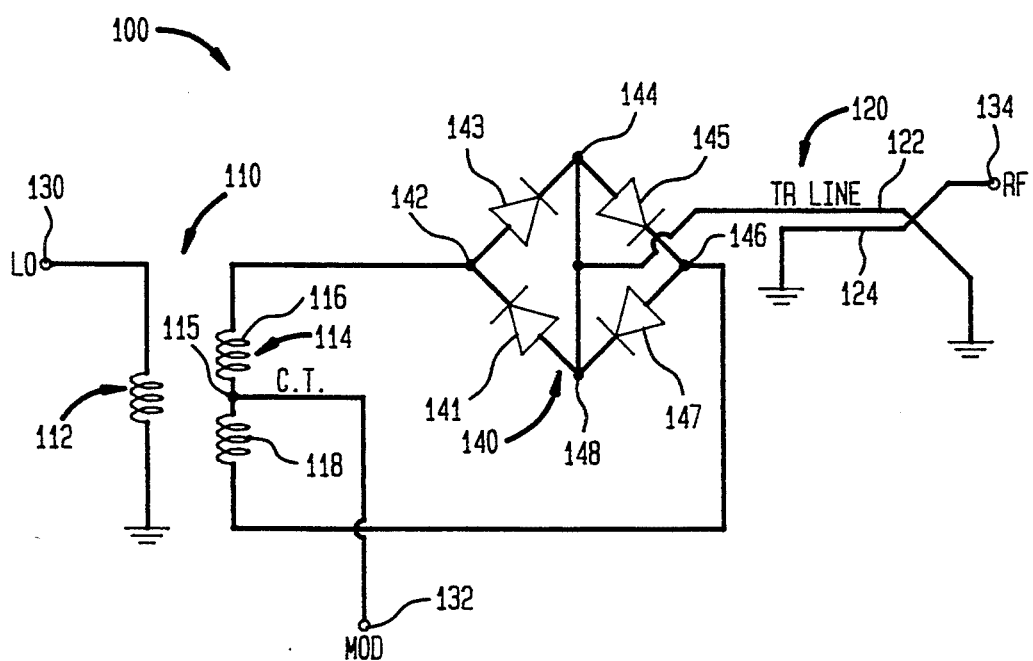
FIG. 2A is a schematic diagram of a harmonic mixer used in a preferred embodiment of the present invention.

One preferred embodiment of harmonic mixers 20 and 30 is shown in more detail in FIG. 2A, which illustrates a harmonic mixer generally designated as 100. Harmonic mixer 100 is preferably used for both harmonic mixers 20 and 30 shown schematically in FIG. 1, and includes a transformer 110, a transmission line 120 and a diode quad ring 140.

Transformer 110 has a primary winding 112 and a secondary winding 114. Although the terms "primary" and "secondary" are used to refer to windings herein, the designation is merely for purposes of convenience and either windings of the transformer 110 can be used to accept an applied signal input or to provide an electrical signal output. One end of primary winding 112 is connected to ground and the other end is connected to local oscillator signal port 130, which corresponds to either first input port 22 of first harmonic mixer 20 or first input port 32 of second harmonic mixer shown in FIG. 1. A center tap 115 on secondary winding 114 is connected half-way between the top and bottom of secondary winding 114 and is connected to modulation input port 132, which corresponds to either first modulation port 28 or second modulation port 38 of the modulator 10 shown in FIG. 1. Thus, secondary winding 114 is effectively divided into two halves, namely top half 116 and bottom half 118. The primary winding 112 should preferably have two to four turns and each half of secondary winding 114 also has preferably two or four turns.

Transmission line 120, which ideally acts as a perfect 180° transformer, is preferably formed from a twisted pair of conductors 122 and 124. Rather than employing an additional radio frequency choke (RFC), the mixer of FIG. 2A provides a DC return for the diodes through the transmission line itself. One end of conductor 122 is connected to diode quad ring 140 and the other end is connected to ground. Conductor 124 is twisted around conductor 122, and one end is connected to radio frequency port 134 and the other end is connected to ground. Although preferably transmission line 120 is formed from twisted conductors, other types of transmission lines can be used such as coaxial lines, shielded pair, two-wire open conductors, microstrip lines, slot lines, etc. so long as the transmission lines used meets the necessary impedance requirements.

Diode quad ring 140 is connected between transformer 110 and transmission line 120, and includes four diodes 141, 143, 145 and 147. Diode junctions 142, 144, 146 and 148 of diode ring quad 140 each join the anode end of one diode and the cathode end of another adjacent diode. Preferably, the diodes are Schottky diodes. Diode junction 142 of diode ring quad 140 is connected to top half 116 of secondary winding 114 of transformer 110 while diode junction 146 is connected to bottom half 118 of secondary winding 114. Diode junctions 144 and 148 are connected to one another thus forming anti-parallel pairs consisting of diodes 141 and 143 and diodes 145 and 147, and conductor 122 of transmission line 120 is connected to diode junctions 144 and 148 at node 149. All diodes 141, 143, 145 and 147 should be matched as closely as possible to one another in terms of impedance and other performance characteristics. The preferred frequency range of the carrier signal introduced to harmonic mixer 100 is between 50 MHz and 1500 MHz.

In operation, harmonic mixer 100 mixes the even harmonic frequencies of the carrier frequency along with the modulation frequency signal introduced at modulation input port 132. By virtue of the antiparallel connection and symmetry of diode ring quad 140, the fundamental and odd harmonic frequencies of the carrier signal mixed with the modulation frequency signal, known as "even order mixed products", are suppressed in the output signal along with the even harmonics of the carrier signal. The odd harmonic frequencies of the carrier signal as well as the modulation signal and its harmonics are passed through in the output signal at port 134 but are sufficiently attenuated by the balance in the transformers and the symmetry of the diodes and can be easily filtered by conventional filtering techniques. Therefore, harmonic mixer 100 is operative to produce a modulated double sideband signal at radio frequency port 134 which is the sums and the differences of the modulation frequency and the even harmonic frequencies of the carrier signal. For example, if a 100 MHz carrier signal and a 1 MHz modulation signal is introduced to mixer 100, an output signal will be produced having frequencies corresponding to the sum and difference of the 1 MHz modulation signal and the even harmonic frequencies of the 100 MHz carrier signal, i.e., an output signal with frequencies of 199/201 MHz, 399/401 MHz, 599/601 MHz, etc. Even harmonic frequencies of the carrier signal, i.e., 200 MHz, 400 MHz, 600 MHz, etc. will be suppressed along with the fundamental and odd harmonics of the carrier signal mixed with the modulation signal, i.e., 99/101 MHz, 299/301 MHz, 499/501 MHz, etc.

Because of the suppression of the even harmonic frequencies of the carrier signal along with the fundamental and odd harmonics of the carrier frequency mixed with the modulation frequency, it is quite easy to design appropriate filters with desired characteristics to eliminate unwanted frequencies which remain present in the modulated output signal. Thus, low-pass, high-pass and band-pass filters can be used to achieve an appropriate filtered output signal. For example, in an upper sideband modulator which quadrupled the frequency of a 100 MHz carrier signal mixed with a 1 MHz modulation signal, the output signal would consist of the following frequencies: 201 MHz (from the mixing of the modulation signal with second harmonic of the carrier), 401 MHz (from the mixing of the modulation signal with the fourth harmonic of the carrier) 300, 500, 700 MHz etc. (the odd harmonics of the carrier frequency), and 1, 2, 3, 4 MHz etc. (the harmonic frequencies of the modulation frequency). The 201 MHz frequency, along with all of the other output frequencies excluding the 401 MHz frequency, can be easily filtered since these frequencies are far enough apart in frequency from the desired 401 MHz output frequency.

Figure 2B:
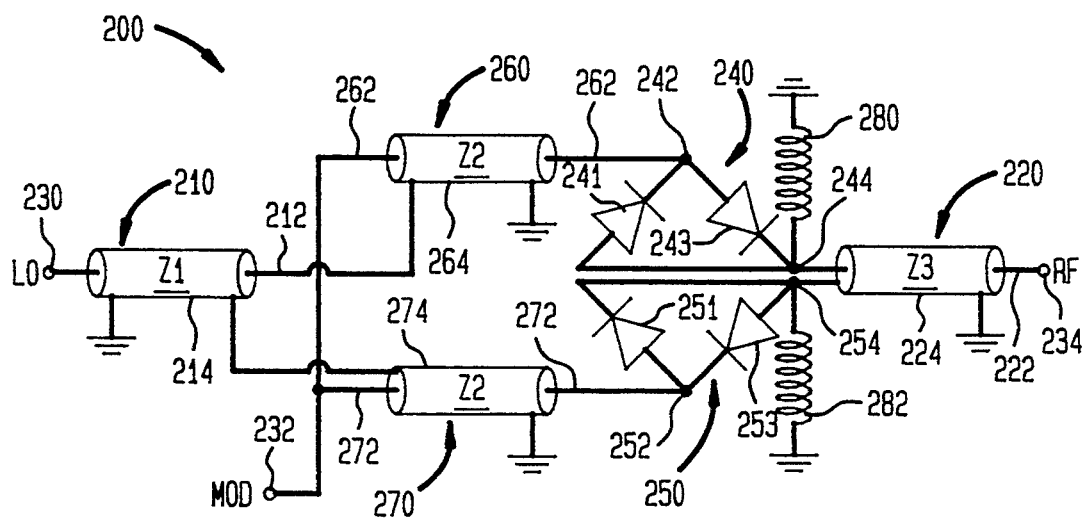
FIG. 2B is a schematic diagram of a harmonic mixer used in another preferred embodiment of the present invention.

Another preferred embodiment of a harmonic mixer used in accordance with the present invention is shown in FIG. 2B. This harmonic mixer, generally designated as 200, comprises transmission lines 210, 260 and 270 interconnected in such a way they form a balanced to unbalanced transformer with a center tap connected at modulation port 232. Harmonic mixer 200 further includes a first diode pair 240 consisting of diodes 241 and 243 and a second diode pair 250 consisting of diodes 251 and 253. Transmission line 210 has a first impedance Z1 and is formed from a pair of conductors 212 and 214. Similarly, first and second secondary transmission lines 260 and 270 each have a second impedance Z2 and are formed from pairs of coaxial conductors 262 and 264 and 272 and 274. Transmission line 220 has a third impedance Z3 and is formed from a pair of coaxial conductors 222 and 224. Preferably, the conductors of transmission lines 210, 220, 260 and 270 have a coaxial configuration. However, other types of transmission lines may be used such as two-wire open lines, twisted pair, shielded pair, microstrip lines, slot lines, etc. so long as the impedance requirements of the transmission lines are properly accounted for. The length of these transmission lines also plays an important role in impedance matching.

First diode pair 240 includes an input diode junction 242 which joins the cathode end of diode 241 and the anode end of diode 243 and includes an output diode junction 244 which joins the anode end of diode 241 and the cathode end of diode 243. Second diode pair 250 likewise includes an input diode junction 252 and an output diode junction 254. Input diode junction 252 joins the anode end of diode 251 and the cathode end of diode 253 while output diode junction 254 joins the cathode end of diode 251 and the anode end of diode 253. Preferably, diodes 241, 243, 251 and 253 are Schottky diodes. First diode pair 240 is connected between conductor 262 of transmission line 260 and conductor 222 of transmission line 220. Second diode pair 250 is connected between conductor 272 of transmission line 270 and conductor 224 of transmission line 220.

Connected to diode output diode junction 244 is an inductor 280 which is in turn connected to ground. Likewise, an inductor 282 is connected between output diode junction 254 and ground. Inductors 280 and 282 serve as radio frequency chokes (RFCs) to provide a DC return for the diodes. Preferably, the values of inductors 280 and 282 should be such that the reactance is ten times greater than the impedance at diode junctions 244 and 254.

Input diode junction 242 is connected to conductor 262 of transmission line 260 which is in turn connected to modulation input port 232. Likewise, input diode junction 252 is connected to conductor 272 of transmission line 270 which is in turn also connected to modulation input port 232. Output diode junction 244 of first diode pair 240 is connected to conductor 222 of transmission line 220 which is in turn connected to radio frequency port 134. Output diode junction 254 of second diode pair 250 is connected to conductor 224 transmission line 220 which is in turn connected to ground. Conductor 212 of transmission line 210 is connected at one end to conductor 264 of transmission line 260 which is in turn connected to ground. The other end of conductor 212 is connected to local oscillator port 230. Conductor 214 of transmission line 210 is connected to conductor 274 of transmission line 270 which is in turn connected to ground. Characteristic impedances Z1, Z2 and Z3 are corresponding lengths are chosen such that good impedance matching exists between radio frequency port 234 and the diode pairs, the carrier input port 230 and the diode pairs, and between modulation port 232 and the diode pairs. This is necessary to achieve maximum transfer of energy between the circuit elements. In addition, the preferred frequency range of the carrier signal introduced to harmonic mixer 200 is between 0.7 GHz to 26 GHz.

Figure 2C:
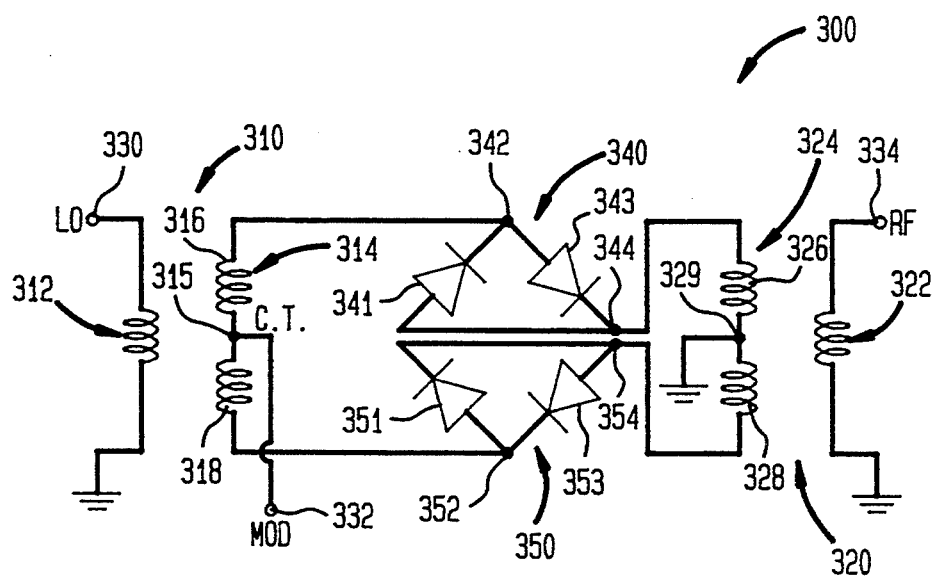
FIG. 2C is a schematic diagram of a harmonic mixer used in yet another preferred embodiment of the present invention.

Yet another preferred embodiment of a harmonic mixer used in accordance with the present invention is shown in FIG. 2C. This harmonic mixer, generally designated as 300, comprises a first transformer 310, a second transformer 320, a first diode pair 350 and a second diode pair 340. First transformer 310 has a primary winding 312 and a secondary winding 314. One end of primary winding 312 is connected to ground and the other end is connected to local oscillator signal port 330. A center tap 315 on secondary winding 314 is connected halfway between top and bottom secondary winding 314 and is connected to modulation input port 332. Secondary winding 314 is therefore divided into two halves, top half 316 and bottom half 318. Transformer 320 includes a primary winding 322 and a secondary winding 324. One end of primary winding 322 is connected to radio frequency output port 334 and the other end is connected to ground. A center tap 329 on secondary winding 324 is connected halfway between the top and bottom of secondary winding 324 and is in turn connected to ground. First diode pair 340 includes diodes 341 and 343, an input diode junction 342 and an output diode junction 344. Input diode junction 342 joins the cathode end of diode 341 and the anode end of diode 343 while output diode junction 344 joins the cathode end of diode 343 and the anode end of diode 341. Input diode junction 342 is connected to top half 316 of secondary winding 314 of transformer 310 while output diode junction 344 is connected to top half 326 of secondary winding 324 of transformer 320. The preferred frequency range of the carrier signal introduced to harmonic mixer 300 is between 10 MHz and 500 MHz.

Second diode pair 350 includes diodes 351 and 353, an input diode junction 352 and an output diode junction 354. Input diode junction 352 joins the anode end of diode 351 and the cathode end of diode 353 while output diode junction 354 joins the cathode end of diode 351 and the anode end of diode 353. Input diode junction 352 is connected to bottom half 318 of secondary winding 314 of transformer 310 while diode output junction 354 is connected to bottom half 328 of secondary winding 324 of transformer 320. The preferred frequency range of the carrier signal introduced to the harmonic mixer 300 is between 10 MHz and 500 MHz.

Figure 2D:
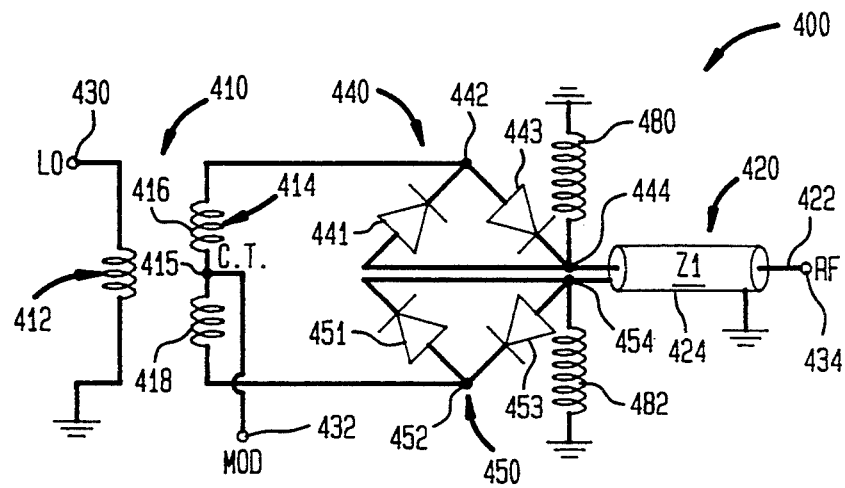
FIG. 2D is a schematic diagram of a harmonic mixer used in a further preferred embodiment of the present invention.

A further preferred embodiment of a harmonic mixer used in accordance with the present invention is shown in FIG. 2D. This harmonic mixer, generally designated as 400, comprises a first transformer 410, a transmission line 420, a first diode pair 440 and a second diode pair 450. First transformer 410 has a primary winding 412 and a secondary winding 414. One end of primary winding 412 is connected to ground and the other end is connected to local oscillator signal port 430. A center tap 415 on secondary winding 414 is connected halfway between top and bottom of secondary winding 414 and is connected to modulation input 432. Secondary winding 414 is divided into two halves, namely top half 416 and bottom half 418.

Transmission line 420 has a first impedance Z1 and is preferably formed from a pair of coaxial conductors 422 and 424. First diode pair 440 includes diodes 441 and 443, an input diode junction 442 and an output diode junction 444. Likewise, second diode pair 450 includes diodes 451 and 453, an input diode junction 452 and an output diode junction 454. Preferably, diodes 441, 443, 451 and 453 and Schottky diodes.

Input diode junction 442 of first diode ring 440 is connected to upper half 416 of secondary winding 414 of transformer 410. Output diode junction 444 is connected to conductor 422 of transmission line 420 and its length are so chosen that the transmission line 420 which is in turn connected to radio frequency port 434. Output diode junction 444 is also connected to radio frequency choke (RFC) or inductor 480 which is in turn connected to ground.

Input diode junction 452 of second diode pair 450 is connected to bottom half 418 of secondary windings 414 of transformer 410. Diode output junction 454 of second diode pair 450 is connected to conductor 424 which is in turn connected to ground. Also connected to output diode junction 454 is radio frequency choke (RFC) or inductor 482 which is in turn connected to ground. The characteristic impedance Z1 of output transmission line 420 and its length are chosen so that the transmission line matches the impedance of the RF port to diode impedance when the carrier signal of an appropriate strength is applied to carrier port 430. In addition, harmonic mixer 400 preferably accepts an input carrier signal within the frequencies of 0.2 to 3 GHz.

Figure 2E:
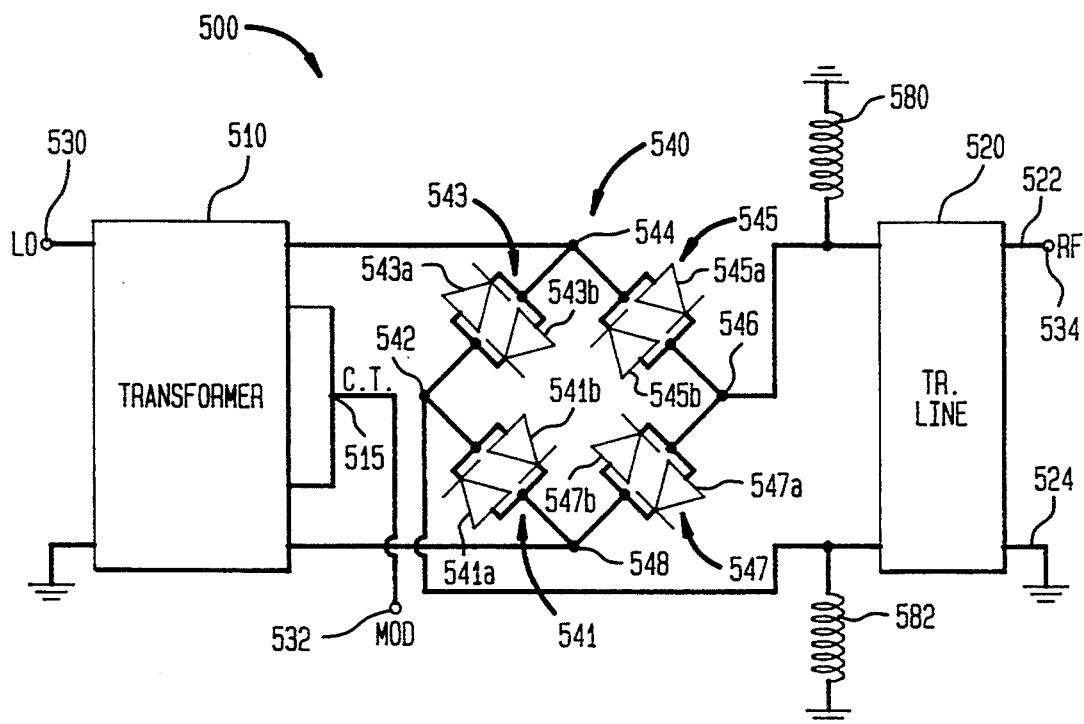
FIG. 2E is a schematic diagram of a harmonic mixer used in yet a further preferred embodiment of the present invention.

A yet further preferred embodiment of a harmonic mixer used in accordance with the present invention is shown in FIG. 2E. This harmonic mixer, generally designated as 500, comprises a first transformer 510, a transmission line 520 and a diode quad ring 540. Transformer 510 has a primary winding and a secondary winding (not shown) and includes a center tap 515 which is in turn connected to modulation input port 532. Transmission line 520, shown as a labeled box, includes first conductor 522 and second conductor 524. First conductor 522 is connected to radio frequency output port 534 while second conductor 524 is connected to ground.

Diode ring quad 540 is connected between transformer 510 and transmission line 520, and includes four diode pairs 541, 543, 545 and 547, consisting of diodes 541a, 541b, 543a, 543b, 545a, 545b, 547a, 547b. Preferably, all diodes of diode ring quad 540 are Schottky diodes. Diode junctions 542, 544, 546 and 548 each adjoin the anode and cathode end of adjacent diode pairs. For example, the cathode end of diode 453a and the anode end of diode 453b is connected to diode junction 544 while the cathode end of diode 543b and the anode end of diode 543a are connected to diode junction 542. Diode junctions 544 and 548 are connected to secondary windings of transformer 510, while diode junction 546 is connected to conductor 522 of transmission line 520 and diode junction 542 is connected to conductor 524 of transmission line 520. In addition, connected to diode junctions 546 and 542 are radio frequency chokes (RFC) or inductors 580 and 582, which are in turn connected to ground.

The operation of harmonic mixers 200, 300, 400 and 500 are similar to the operation of harmonic mixer 100 previously described, and are operative to mix the even harmonic frequencies of the carrier signal along with the modulation frequency. Again, by the property of the antiparallel diode junctions of the various mixers, the odd harmonic frequencies of the carrier signal mixed with the modulation frequency signal are suppressed in the modulated output signal along with the even harmonics of the carrier signal.

Figure 3:
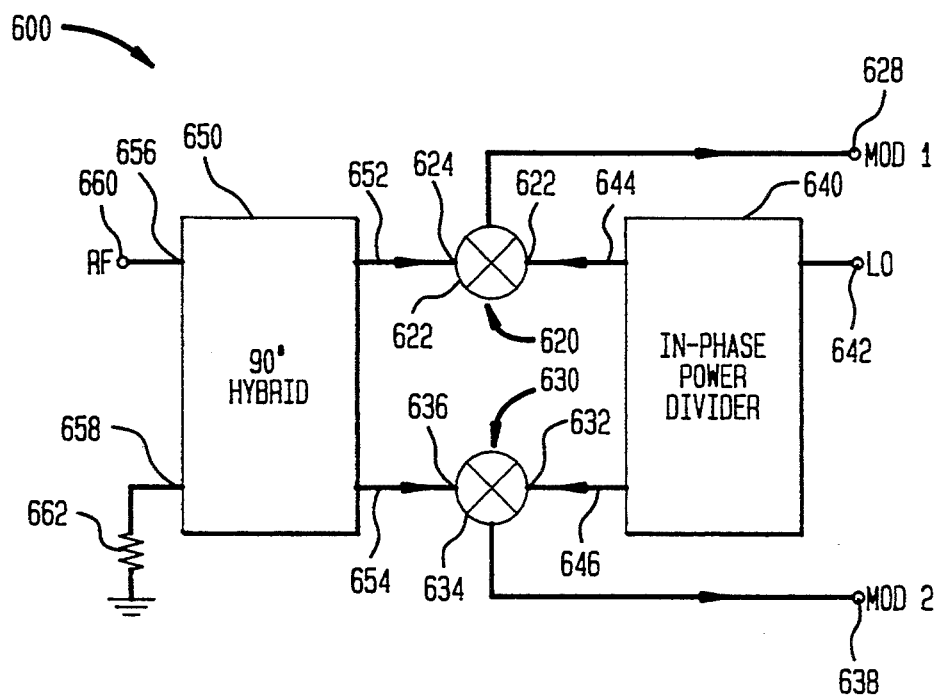
FIG. 3 is a schematic diagram of a preferred embodiment of the present invention configured as a demodulator.

Turning now to FIG. 3, a preferred embodiment of the present invention configured as a demodulator or quadrature IF mixer is shown. The demodulator, generally designated as 600, operates on the same basic principles as modulator 10, but is configured to demodulate or reconstruct the modulated signal introduced.

Demodulator 600 comprises a first harmonic mixer 620, a second harmonic mixer 630, and in-phase power divider 640, and a 90° hybrid 650. Hybrid 650 includes first and second input ports 656 and 658 and first and second output ports 652 and 654. Input port 656 is connected to radio frequency port 660 while input port 658 is connected to resistor 662, which has the same value as the system impedance which is in turn connected to ground. In-phase power divider 640 includes first input port 642 and first and second output ports 644 and 646. Input port 642 is constructed to accept a periodic oscillator or primary carrier signal having a carrier frequency which will be doubled, tripled, quadrupled, etc. by harmonic mixers 620 and 630 in order to match the carrier frequency present in the modulated signal. Harmonic mixer 620 includes first input port 622, second input port 626 and modulation output port 624. Likewise, harmonic mixer 630 includes first input port 632, second input port 636 and output modulation port 634. Output ports 644 and 646 of in-phase power divider 640 are connected to first input ports 622 and 632 of first and second harmonic mixers 620 and 630. Output ports 652 and 654 of 90° hybrid 650 are connected to second input ports 626 and 636 of first and second harmonic mixers 620 and 630.

In operation, a modulated signal is introduced to radio frequency input port 660 and is split by hybrid 650 into two signals which appear at output ports 652 and 654 with a 90° phase difference therebetween. These out-of-phase modulated signals, which each have one-half the power of the modulated signal, are then fed to input ports 626 and 636 of harmonic mixers 620 and 630 where they are mixed with the even harmonics of carrier frequency signals from output ports 644 and 646 of in-phase power divider 340. The resultant demodulated or modulation signals appearing at output ports 628 and

638 are equal signals in strength and frequency but are 90° out of phase.

Figure 4:
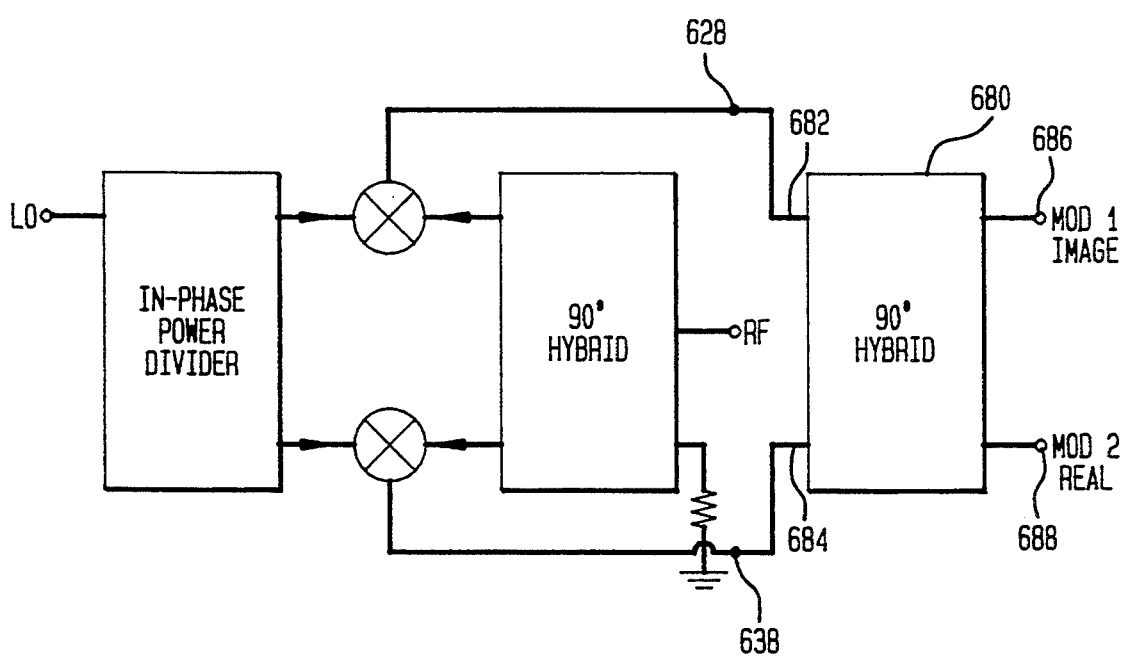
FIG. 4 is a schematic diagram of another preferred embodiment of the present invention configured as an image reject demodulator.

FIG. 4 illustrates a demodulator similar to the demodulator 300 shown in FIG. 3, except it is configured as an image reject demodulator. In this manner, an additional 90° hybrid 680 is added to demodulator 600 as shown. Hybrid 680 includes a first input port 682, a second input port 684, a first output port 686 and a second output port 688. First and second input ports 682 and 684 are connected to modulation output ports 628 and 638 respectively. The function of 90° hybrid 680 is to differentiate the "real" sideband modulation signal from the "image" sideband modulation signal for applications in which the desired and undesired modulation sidebands are so close in frequency that filtering is not practical. Thus, the demodulated signals at output ports 628 and 638 will actually be mirror image sidebands of one another mirrored about the carrier frequency. In order to differentiate these mirror image sideband demodulated signals, the additional 90° hybrid 680 is added such that the image sideband of the modulation signal will appear at output port 686 as the image sideband signal while the real sideband will appear at output port 688 as the real sideband signal.

The benefits of using harmonic mixers in a modulator or demodulator circuit can now be seen. Essentially, one can provide lower frequency carrier signals to achieve high frequency modulated output signals through doubling, tripling, quadrupling, etc. of the lower frequency carrier signal mixed with the modulation frequency. In this manner, one gains all the benefits of using a lower frequency carrier signal and still achieves a high frequency modulated signal, thereby avoiding the need to use modulators with double balanced mixers which require a high frequency input signal to achieve a high frequency output signal.

The advantages gained from the present invention are numerous. Costs are greatly reduced since there is no longer a need to use costly high frequency oscillators to produce high frequency carrier signals to obtain a high frequency modulated signal. In addition, costs are lowered since components such as power dividers used to process lower frequency signals are less expensive than components constructed to handle high frequency signals. Costs associated with phase correction techniques are also reduced since it is more difficult, more costly and labor-intensive to properly correct the circuits' phase characteristics when the input carrier signal is provided at a higher frequency.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A modulator circuit comprising:
   a first harmonic mixer having first and second inputs and an output for providing a first electrical output signal;
   a second harmonic mixer having first and second inputs and an output for providing a second electrical output signal;
   carrier input means for providing first and second electrical input carrier signals to said first inputs of said first and second harmonic mixers respectively, said first and second carrier signals having a carrier frequency; and
   modulation input means for providing first and second electrical input modulation signals to said second inputs of said first and second harmonic mixers respectively, said first and second modulation signals having a modulation frequency and a 90° phase difference therebetween,
   said first and second harmonic mixers being operative to produce said first and second output signals having output frequencies corresponding to both the sum and the difference of said modulation frequency and even harmonic frequencies of said carrier frequency.

2. The circuit as claimed in claim 1, further comprising combining means for combining said first and second output signals to produce by phase cancellation a single sideband output signal having one or more single sideband frequencies corresponding to either the sums or the differences of said modulation frequency and said even harmonic frequencies of said carrier frequency.

3. The circuit as claimed in claim 2, wherein each said single sideband frequency corresponds to a sum of said modulation frequency and an even harmonic frequency of said carrier frequency.

4. The circuit as claimed in claim 3, wherein said single sideband frequency corresponds to the sum of said modulation frequency and a second harmonic frequency of said carrier frequency.

5. The circuit as claimed in claim 3, wherein said single sideband frequency corresponds to the sum of said modulation frequency and a fourth harmonic frequency of said carrier frequency.

6. The circuit as claimed in claim 2, wherein each said single sideband frequency corresponds to a difference of said modulation frequency and an even harmonic frequency of said carrier frequency.

7. The circuits as claimed in claim 7, wherein said single sideband frequency corresponds to the difference of said modulation frequency and a second harmonic frequency of said carrier frequency.

8. The circuits as claimed in claim 7, wherein said single sideband frequency corresponds to the difference of said modulation frequency and a fourth harmonic frequency of said carrier frequency.

9. The circuit as claimed in claim 1, wherein said first and second harmonic mixers are operative to suppress the even harmonic frequencies of said carrier frequency.

10. The circuit as claimed in claim 9, wherein said first and second harmonic mixers are operative to suppress the odd harmonic frequencies of said carrier frequency plus or minus said modulation frequency.

11. The circuit as claimed in claim 9, further comprising filter means for filtering undesired frequencies in said single sideband output signal.

12. The circuit as claimed in claim 11, wherein said filter means comprises a high-pass filter.

13. The circuit as claimed in claim 11, wherein said filter means comprises a low-pass filter.

14. The circuit as claimed in claim 11, wherein said filter means comprises a band-pass filter.

15. The circuit as claimed in claim 2, wherein said combining means comprises a 90° hybrid.

16. The circuit as claimed in claim 1, wherein said carrier input means comprises divider means for receiving and dividing said primary carrier signal into said first and second carrier signals.

17. The circuit as claimed in claim 16, wherein said divider means comprises an in-phase power divider.

18. The circuit as claimed in claim 2, wherein said carrier input means comprises divider means for receiving and dividing a primary carrier signal into a first and second carrier signals.

19. The circuit as claimed in claim 18 where said divider means comprises an in-phase power divider.

20. The circuit as claimed in claim 1, wherein said first and second harmonic mixers each comprise:
a first transformer comprising primary and secondary windings;
a second transformer comprising a transmission line formed by a pair of conductors, said first input of said harmonic mixer being coupled to said primary windings of said first transformer, said second input of said harmonic mixer being coupled to said secondary windings of said first transformer, and said output of said harmonic mixer being coupled to one of said conductors of said transmission line; and
a diode ring quad having a first diode junction between first and second adjacent diodes, a second diode junction between said second and third adjacent diodes, a third diode junction between said third and fourth adjacent diodes and a fourth diode junction between said fourth and said first adjacent diodes, said first diode junction being coupled to said secondary windings of said first transformer and said second and said fourth diode junctions being coupled to the other one of said conductors of said transmission line.

21. The circuit as claimed in claim 1, wherein said first and second harmonic mixers each comprise:
an input transmission line having a first impedance and being coupled to said first input of said harmonic mixer;
first and second intermediate transmission lines each having a second impedance;
an output transmission line having a third impedance;
first and second inductors;
a first diode pair comprising first and second diodes, an input diode junction and an output diode junction, said output diode junction being coupled to said first inductor and to said output transmission line; and
a second diode pair comprising first and second diodes, an input diode junction and an output diode junction, said output junction being coupled to said second inductor and to said second intermediate transmission line;
said first input of said harmonic mixer being coupled to said first and second intermediate transmission lines through said input transmission line, and said second input of said harmonic mixer being coupled to said input diode junctions of said first and second diode pairs through said first and second intermediate transmission lines.

22. The circuit as claimed in claim 21, wherein said carrier transmission line and said first and second intermediate transmission lines form an unbalanced to balanced transformer.

23. The circuit as claimed in claim 1, wherein said first and second harmonic mixers each comprise:
a first transformer comprising primary and secondary windings;
a second transformer comprising primary and secondary windings;
a first diode pair comprising first and second diodes, an input diode junction and an output diode junction, said input diode junction being coupled to said secondary windings of said first transformer and said output diode junction being coupled to said secondary windings of said second transformer; and
a second diode pair comprising first and second diodes, an input diode junction and an output diode junction, said input diode junction being coupled to said secondary windings of said first transformer and said output diode junction being coupled to said secondary windings of said second transformer,
said first input of said harmonic mixer being coupled to said primary windings of said first transformer, said second input of said harmonic mixer being coupled to said secondary windings of said first transformer, and said output of said harmonic mixer being coupled to said primary windings of said second transformer.

24. The circuit as claimed in claim 1, wherein said first and second harmonic mixers each comprise:
a transformer comprising primary and secondary windings, said first input of said harmonic mixer being coupled to said primary windings and said second input of said harmonic mixer being coupled to said secondary windings;
an output transmission line having a first impedance;
first and second inductors;
a first diode pair comprising first and second diodes, an input diode junction and an output diode junction, said output diode junction being coupled to said first inductor and to said output transmission line; and
a second diode pair comprising first and second diodes, an input diode junction and an output diode junction, said output diode junction being coupled to said second inductor and to said output transmission line,
said input junctions of said first and second diode pairs being coupled to said secondary windings of said transformer.

25. The circuit as claimed in claim 1, wherein said first and second harmonic mixers each comprise:
a first transformer comprising primary and secondary windings, said primary windings being coupled to said first input of said harmonic mixer and said secondary windings being connected to said second input of said harmonic mixer;
a second transformer comprising a transmission line comprising first and second conductors;
first and second inductors; and
a diode ring quad having a first diode junction between first and second adjacent diode pairs, a second diode junction between said second and third adjacent diode pairs, a third diode junction between said third and fourth adjacent diode pairs, and a fourth diode junction between said fourth and said first adjacent diode pairs, said first and third diode junctions being coupled to said secondary windings of said first transformer and said second and fourth diode junctions being coupled to said second transformer and to said first and second inductors, said output of said harmonic mixer being coupled to one of said conductors of said transmission line.

26. The circuit as claimed in claim 11, wherein said single sideband frequency is at least two times said carrier frequency plus or minus said modulation frequency.

27. The circuit as claimed in claim 11, wherein said single sideband frequency is at least four times the frequency of said carrier frequency plus or minus said modulation frequency.

28. A harmonic mixer comprising:
a first transformer comprising primary and secondary windings;
a second transformer comprising a transmission line formed by a pair of conductors;
a first input being coupled to said primary windings of said first transformer;
a second input coupled to said secondary windings of said first transformer;
an output coupled to one of said conductors of said transmission line; and
a diode ring quad having a first diode junction between first and second adjacent diodes, a second diode junction between said second and third adjacent diodes, a third diode junction between said third and fourth adjacent diodes and a fourth diode junction between said fourth and said first adjacent diodes, said first diode junction being coupled to said secondary windings of said first transformer and said second and said fourth diode junctions being coupled to the other one of said conductors of said transmission line.

29. The harmonic mixer as claimed in claim 28, wherein said pair of conductors are in a twisted pair configuration.

30. A demodulator circuit comprising:
a first harmonic mixer having first and second inputs and an output for providing a first electrical output signal;
a second harmonic mixer having first and second inputs and an output for providing a second electrical output signal;
carrier input means for providing first and second electrical input carrier signals having a carrier frequency to said first inputs of said first and second harmonic mixers respectively, said first and second carrier signals having a carrier frequency; and
modulated input means for providing first and second electrical input modulated signals to said second inputs of said first and second harmonic mixers respectively, said first and second modulated signals having a 90° phase difference therebetween and a modulated frequency corresponding to either the sum or the difference of a modulation frequency of a modulation signal and at least one even harmonic frequency of said carrier frequency,
said first and second harmonic mixers being operative to produce first and second demodulated output signals at said modulation frequency with a 90° phase difference therebetween.

31. The circuit as claimed in claim 30, further comprising combining means for combining said demodulated output signals to produce a first real sideband output signal corresponding to said modulation signal and a second image sideband output signal corresponding to a mirror sideband image of said modulation signal.

32. The circuit as claimed in claim 31, wherein said combining means comprises a 90° hybrid.

33. The circuit as claimed in claim 30, wherein said modulated input means comprises a 90° hybrid having an input for receiving a primary modulated signal, said 90° hybrid being operative to divide said primary modulated signal into said first and second modulated signals.

34. The circuit as claimed in claim 30, wherein said carrier input means comprises divider means for receiving and dividing a primary carrier signal into said first and second carrier signals.

35. The circuit as claimed in claim 34, wherein said divider means comprises an in-phase power divider.

36. A method of modulating electrical signals comprising the steps of:
(a) providing a first electrical input carrier signal to a first input of a first harmonic mixer;
(b) providing a second electrical input carrier signal to a first input of a second harmonic mixer, said first and second carrier signals having a carrier frequency;
(c) providing a first electrical input modulation signal to a second input of said first harmonic mixer;
(d) providing a second electrical modulation signal to a second input of said second harmonic mixer, said first and second modulation signals having a modulation frequency and a 90° phase difference therebetween;
(e) mixing said first carrier signal and said first modulation signal in said first harmonic mixer to produce a first output signal; and
(f) mixing said second carrier signal and said second modulation signal in said second harmonic mixer to produce a second output signal,
said first and second output signals having an output frequencies at the sums and the differences of said modulation frequency and even harmonic frequencies of said carrier frequency.

37. The method as claimed in claim 36, further comprising the step of combining said first and second output signals to produce by phase cancellation a single sideband output signal having at least one single sideband frequency, each single sideband frequency being either the sum or the difference of said modulation frequency and one said even harmonic frequency of said carrier frequency.

38. A method of demodulating an electrical signal comprising the steps of:
(a) providing a first electrical input carrier signal to a first input of a first harmonic mixer;
(b) providing a second electrical input carrier signal to a first input of a second harmonic mixer, said first and second signals having a carrier frequency;
(c) providing a first electrical input modulated signal to a second input of said first harmonic mixer;
(d) providing a second electrical input modulated signal to a second input of said second harmonic mixer, said first and second modulated signals having a 90° phase difference therebetween and a modulated frequency at either the sum or the difference of a modulation frequency of a modulation signal and even harmonic frequencies of said carrier frequency;
(e) mixing said first carrier signal and said first modulated signal in said first harmonic mixer to form a first demodulated output signal; and
(f) mixing said second carrier signal and said second modulated signal in said second harmonic mixer to form a second demodulated output signal, said first and second demodulated output signals having said modulation frequency and a 90° phase difference therebetween.

39. The method as claimed in claim 38, further comprising the step of combining said demodulated output signals to produce a first real sideband output signal corresponding to said modulation signal and a second image sideband output signal corresponding to a mirror sideband image of said modulation signal.

* * * * *